United States Patent
Fujita et al.

(10) Patent No.: US 6,654,096 B1
(45) Date of Patent: Nov. 25, 2003

(54) EXPOSURE APPARATUS, AND DEVICE MANUFACTURING METHOD

(75) Inventors: Itaru Fujita, Utsunomiya (JP); Izumi Tsukamoto, Tokyo (JP); Hideki Nogawa, Utsunomiya (JP); Yukio Takabayashi, Oomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/658,462

(22) Filed: Sep. 8, 2000

(30) Foreign Application Priority Data

Sep. 9, 1999 (JP) .......................... 11-255071

(51) Int. Cl.[7] .................. G03B 27/68; G03B 27/42; G03B 27/52
(52) U.S. Cl. .................. 355/52; 355/53; 355/55
(58) Field of Search ................ 355/52, 53, 55, 355/61

(56) References Cited

U.S. PATENT DOCUMENTS

| | | | | |
|---|---|---|---|---|
| 4,558,949 A | * | 12/1985 | Uehara et al. ......... 356/139.07 |
| 4,962,423 A | | 10/1990 | Yamada et al. ............. 358/101 |
| 5,101,226 A | * | 3/1992 | Beaulieu et al. ............. 355/53 |
| 5,483,056 A | * | 1/1996 | Imai ........................ 250/201.4 |
| 5,734,462 A | * | 3/1998 | Sakai .......................... 355/53 |
| 5,825,043 A | * | 10/1998 | Suwa ........................ 250/548 |
| 6,122,036 A | * | 9/2000 | Yamasaki et al. ............. 355/53 |
| 6,151,100 A | * | 11/2000 | Yamane et al. ............... 355/53 |
| 6,151,102 A | * | 11/2000 | Nishi ........................ 250/584 |

* cited by examiner

*Primary Examiner*—Rodney Fuller
(74) *Attorney, Agent, or Firm*—Fitzpatrick, Cella, Harper & Scinto

(57) ABSTRACT

An exposure apparatus for lithographically transferring a pattern of an original onto a substrate to be exposed includes a first detector for detecting a position of an alignment mark on an exposure shot formed on the substrate, a second detector for detecting a local tilt adjacent to the alignment mark, the position of which is detected by the first detector, and a third detector for detecting a tilt of the exposure shot.

14 Claims, 6 Drawing Sheets

EXPOSURE APPARATUS, AND DEVICE MANUFACTURING METHOD

FIELD OF THE INVENTION AND RELATED ART

This invention relates to a projection exposure apparatus and a device manufacturing method, for photolithographically transferring a fine pattern formed on an original onto a substrate such as a wafer, for example.

The fine pattern forming procedure for a semiconductor device or a liquid crystal display, for example, uses a projection transfer technology, called photolithography. The projection transfer is performed in the following manner. An original pattern formed on a quartz glass substrate, called a reticle or a mask, is illuminated. In response, through a projection optical system, a latent image pattern is photolithographically transferred onto a substrate such as a semiconductor wafer or a liquid crystal forming glass substrate, for example. The latent image pattern is then developed into a resist pattern. Thereafter, an etching process of a high processing selection ratio between the pattern and the base material surface underlying the resist is performed, whereby the substrate is microprocessed.

In the projection exposure process included in such a fine pattern forming procedure, particularly for production of a semiconductor device as represented by current MPU or DRAM wherein extraordinary minuteness and very high processing precision are required, a reduction projection exposure apparatus called a stepper is mainly used. The stepper is a step-and-repeat type exposure apparatus wherein equivalently divided exposure regions (exposure shots) on a wafer are sequentially moved into an exposure picture angle below a projection optical system by means of a wafer carrying stage, whereby pattern exposures are repeatedly performed.

There is a step-and-scan type exposure apparatus, called a scanner. In this type of exposure apparatus, a wafer and a reticle are scanned and exposed while being scanningly moved relative to a projection optical system having a rectangular illumination region. As compared with a stepper, it has a wider exposure picture angle, and the pattern uniformness is higher.

In any of the stepper and the scanner, in order to meet requirements, of miniaturization of a semiconductor, improvements of the resolving power of a projection optical system have been desired. Many attempts have therefore been made in the development and products.

Examples of conventional measures for improving the resolution of a projection optical system are enlarging the numerical aperture (NA) of a projection optical system while holding the wavelength fixed, and shortening the exposure wavelength such as from g-line to i-line or to the emission wavelength of a KrF or ArF excimer laser, for example. Also, there is a shape changing illumination method in which the shape of an illumination light source is changed to enhance oblique incidence illumination light, or a phase shift mask method wherein a phase difference is produced in transmission light between adjacent reticle patterns. These are attempts to extend the process limit in the optical exposure.

With the improvements in the resolving power, the semiconductor process requires a more strict control precision, while the process margin such as, for example, the depth of focus of a projection optical system and a total overlay tolerance, is being reduced. On the other hand, separately from the improvements of resolution, improvements of the overlay precision itself have been required. This is for the reason that improving the overlay precision leads to narrowing the layout margin which enables reduction of the device size. This leads to an increase of device yield rate per a unit substrate, and thus to a decrease of the cost.

In projection exposure apparatuses, in order to meet these requirements, improvements are being made in regard to an exposure focus system and an alignment system which is directly influential to the overlay precision. Now, a conventional example of an exposure focus system will be described and, after that, an alignment system influential to the overlay precision will be described.

A focus detecting unit in am exposure focus system generally comprises an off-axis type wherein a probe light is obliquely projected onto a surface to be detected and wherein the focus detection is made on the basis of the position where the reflected light is collected. Usually, the detecting unit is fixed at the peripheral portion of an image plane of the projection optical system. In a stepper, after an exposure shot is positioned within the exposure picture angle, a wafer stage is moved upwardly/downwardly and tilted (for focusing) on the basis of the tilt amount and the level of the wafer surface as measured by the detecting unit, whereby the imaging plans of the projection lens and the plane of the transfer region are brought into registration. The exposure is then performed. In a scanner, the measurement and the focusing process described above are performed simultaneously with the scan exposure.

The wafer alignment is definitely a dominant factor of the overlay precision. The alignment system comprises an alignment detecting unit for measuring alignment marks formed on a wafer, and aligning means for positioning each shot at the exposure position on the basis of the results of processing the measured values of the positions in accordance with a predetermined method. The former alignment detecting unit measures the position of an exposure shot on the basis of the positions of alignment marks formed adjacent to that exposure shot. As regards the detection method, there is a TTL method wherein the position measurement is made through a projection optical system, and an off-axis method wherein the measurement is made without intervention of a projection optical system. In both of these methods, for the detection, a focusing operation for bringing the wafer alignment mark into registration with the detection plane is necessary. The measurement of the detection plane level is made also by using the focus detecting unit of the projection optical system or, alternatively, the alignment system itself has a focus detecting device.

As regards the aligning means, there is a die-by-die method wherein, for every exposure shot, the exposure position is measured and the alignment operation is made. However, at present, an alignment method called a global alignment method is used in many cases. In this alignment method, position measurement is made to sample shots of an appropriate number designated beforehand, and all the shot positions are estimated by preparing a linear correction formula to the positions on the basis of the results of measurements. By the position correction formula based on the global alignment method, not only the wafer shift component but also the magnification, the orthogonality and the rotation of the wafer as a whole related to the shot layout can be corrected. Further, depending on the measurement point, the magnification and the rotation of the shot itself can be corrected. As described, the global alignment method has superior advantages such as higher throughput and precise alignment, for example. Additionally, because the alignment operation is made to the whole wafer surface region in accordance with the same correction formula, the state of alignment can be detected once measurements are made to a few points on the substrate. Thus, this method is superior also in respect to the easiness in use.

On the other hand, when the positional deviation between exposure shots has no linearity to the position, namely, when it has a non-linearity, the non-linear deviation swerving from the linear correction amount directly leads to an alignment error, which causes degradation of the overlay precision. Further, when a non-linear deviation is produced at a sample shot position, it causes an error in the linear correction formula to be determined on the basis of the sample shot position. Therefore, with respect to the improvement of the overlay precision, reducing the non-linear deviation between exposure shots is an important matter.

As described above, the overlay precision is becoming more strict and the necessity of reducing the aforementioned non-linear deviation is becoming larger. Thus, the subject range for factors which are attributable to the production of non-linear deviation, to be suppressed, becomes wider and wider. Particularly, one of the factors which recently became obvious is the distortion along the wafer surface direction caused at the same time of wafer chucking. This is phenomenon that local extension/contraction is produced in the wafer surface to cause shift of the position of an alignment mark or a pattern to be printed.

In a projection exposure apparatus, generally, a wafer is vacuum attracted to a pin contact chuck having an assured flatness, to thereby perform flatness correction of the wafer. However, if a foreign substance is trapped between the pin and the wafer or when the surface irregularity shape of the wafer contact face is changed by presence of any deposition, resulting from a film forming process such as a CVD process, for example, or, alternatively, when the state of contact between the pin and the wafer surface irregularity shape is changed due to a change in positional relationship between the chuck and the wafer through repetition of the exposure process, distortion may be caused in the wafer due to a bending moment produced by the attraction reactive force of the wafer contact face. On such an occasion, in accordance with the distortion distribution produced in the wafer, there occurs a non-linear shift between exposure shots, causing degradation of the overlay precision.

The cause for such non-linear shift will be explained with reference to FIG. 6.

FIG. 6 shows a state in which distortion is produced in a wafer placed on a pin contact chuck, due to a foreign substance trapped therebetween. Denoted at $P_1, P_2, \ldots$, are pins of the pin contact chuck. Denoted at W is a wafer of a thickness 2h, and denoted at D in a foreign substance which is trapped between the pin $P_2$ and the wafer W. The reference plane for the pin height is defined by a plane O-R, and the detection plane to be considered here is a plane $B-B_1$. If there is no trapping of a substance D, the wafer W will be held by the pins $P_1, P_2, \ldots$, so that the plane $O-O_1$ on the pin $P_1$, the detection plane $B-B_1$, the plane $A-A_1$ on the pin $P_2$ will be parallel to each other. However, if there is a foreign substance D trapped upon the pin $P_2$, because of the presence of this substance D, a bending moment is produced in accordance with the difference in level between the supporting points O and A for the wafer W. As a result of it, the detection plane $B-B_1$ is tilted by a small angle $\Delta\theta$ with respect to the plane $O-O_1$. Here, the plane $O_2-B_2-A_2$ depicted by a dash-and-dot line in the drawing, at the center of the section of the wafer W, is a neutral plane where no extension/contraction is produced by the bending moment. Here, (1) if, from the second order or higher of the angle $\Delta\theta$, a change in distance along the pin height reference plane direction due to the bending moment is disregarded and (2) if it is assumed that the plane $B-B_1$ is orthogonal to the neutral plane $O_2-B_2-A_2$ (Bernoulli-Navier hypothesis), than the shift $\Delta r$ to be produced by the trapping of the foreign substance D can be expressed by the following equation:

$$\Delta r = h \times \Delta\theta$$

The small angle $\Delta\theta$ represents the tilt of the wafer surface with respect to the pin height reference plane O-R, that is, the chuck reference plane. Therefore, if the small angle $\Delta\theta$ can be detected at the alignment mark surface, the aforementioned non-linear shift amount may be calculated and it say be subtracted from a measured value, by which a proper shot position linear correction formula can be obtained. Thus, the alignment precision can be improved.

However, alignment systems in conventional exposure apparatuses involve the following problems.

(1) Conventional exposure apparatuses are not equipped with a function for detecting a small angle $\Delta\theta$ at a surface adjacent to an alignment mark.

(2) Although a small angle $\Delta\theta$ at a surface adjacent to an alignment mark could be, for the present, measured by using a focus system for detecting the surface to be exposed, if the angle $\Delta\theta$ is measured before or after the measurement through an alignment detection system, the wafer position becomes different for the alignment measurement and for the focus measurement. This necessitates the addition of time for moving the wafer to the focus measurement position and, as a result of it, the throughput of the exposure apparatus is lowered.

Further, since in the focus system for detecting the surface to be exposed, the distance between the wafer surface level measurement points is set to be approximately equal to the exposure shot region length (10–20 mm), in order to measure a tilt of each local alignment mark region of a size of about 0.1 mm square, the measurement process has to be done plural times while changing the wafer position to the same extent. In this case, the focus measurement time increases considerably, which results is degradation of the throughput.

(3) There is a more serious problem. It is a non-linear positional deviation between the time for forming an alignment mark by exposure and the time for measuring the alignment. More specifically, the small angle $\Delta\theta$ at a surface adjacent to an alignment mark, which is the subject of measurement for correction of the shift amount, corresponds to the difference between a tilt $\Delta\theta_{pr}$ of the alignment mark surface when it is formed and a tilt of $\Delta\theta_{po}$ at the time of measurement.

Therefore, it is necessary to measure the tilt $\Delta\theta_{pr}$ at the time of alignment mark formation, to store the value $\Delta\theta$, as a hysteresis value, to read out the hysteresis value $\Delta\theta_{pr}$ upon measurement of the alignment mark position, and to calculate the value of a small angle $\Delta\theta$ from the values $\Delta\theta_{pr}$ and $\Delta\theta_{po}$. However, measurement of $\Delta\theta_{pr}$ involves similar problems as has been described in Items (1) and (2) above. Further, conventional exposure apparatuses are not equipped with a function for storing and reading out $\Delta\theta_{pr}$.

As regards a non-linear shift of an exposure shot position itself, like the alignment it can be corrected on the basis of s small angle $\Delta\theta_a$ of the shot surface. Practically, in the exposure process, detection and correction of the small angle $\Delta\theta_a$ is performed by using an exposure focus system.

However, conventional exposure apparatuses are not equipped with a function for correcting the exposure shot position on the basis of the small angle $\Delta\theta_a$. Further, like the matter described in item (3) above, what is the problem to be considered in respect to the overlay precision is, more exactly, a non-linear shift to be produced between a preceding exposure for forming a pattern on an underlying layer in a particular exposure shot and a current exposure of a resist lying thereon in that shot. More specifically, the small angle $\Delta\theta_a$ of the shot surface which is the subject of measurement to be done is defined by the difference between a tilt $\Delta\theta_{arp}$ of the surface to be exposed, at the time of a preceding exposure for forming a pattern on an underlying layer, and a tilt $\Delta\theta_{apo}$ of the surface to be exposed, at the time of a current exposure of a resist lying thereon. On the other hand, while the tilt $\Delta\theta_{apr}$ of the surface to be exposed is detected by a focus system at the time of exposure for forming a pattern on an underlying layer, it is not stored as an exposure hysteresis. Therefore, as accurate tilt $\Delta\theta_a$ can not be detected by calculating the difference between $\Delta\theta_{apr}$ and $\Delta\theta_{apo}$.

SUMMARY OF THE INVENTION

It is accordingly an object of the present invention to provide a projection exposure apparatus and/or a device manufacturing method by which a non-linear shift of an alignment mark of an exposure shot due to distortion of a substrate such as a wafer, along a substrate surface direction, to be produced when the substrate is chucked, can be calculated accurately to enable position correction and thus to improve the overlay precision.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
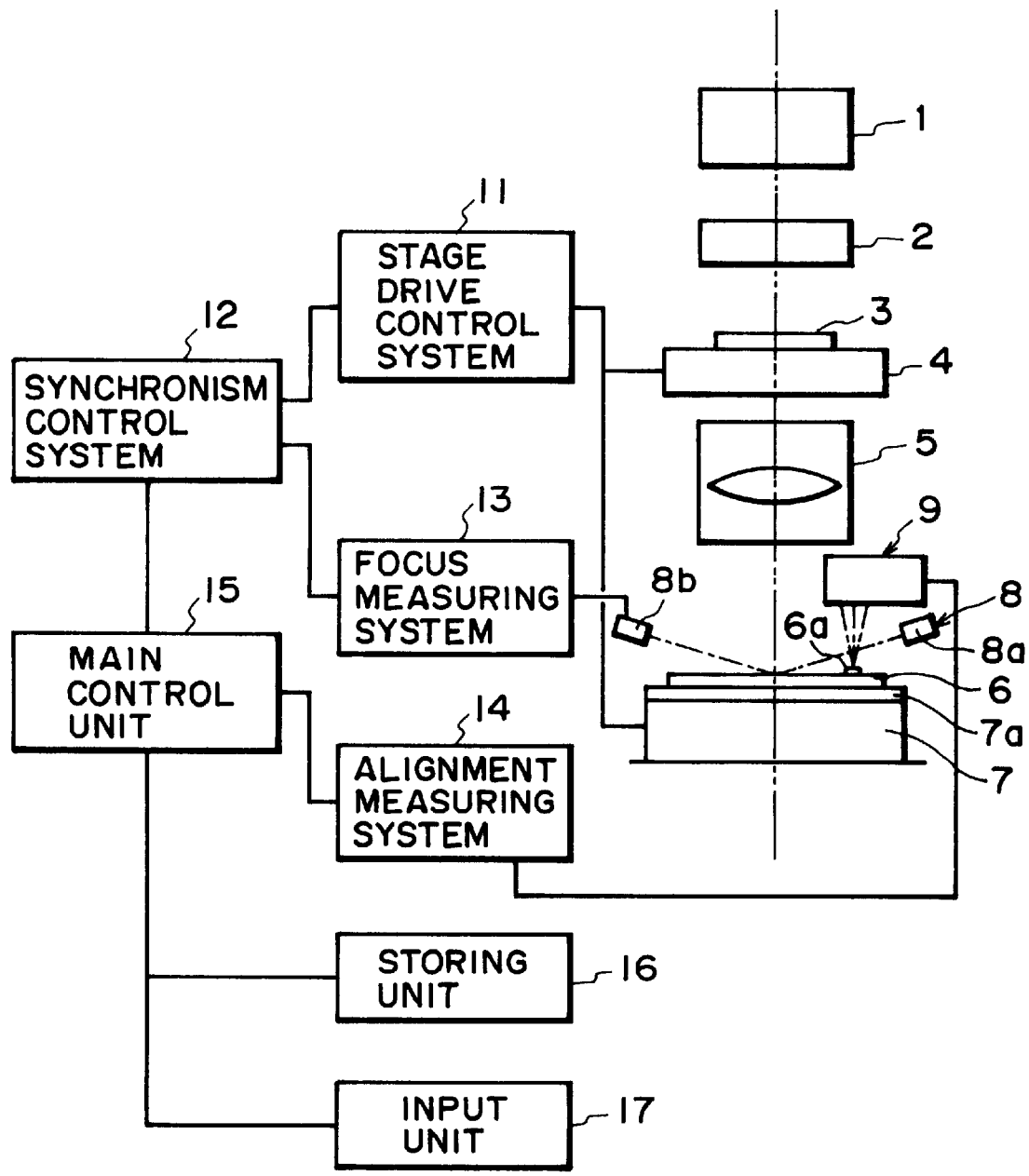
FIG. 1 is a schematic and diagrammatic view of.a main portion of a projection exposure apparatus according to an embodiment of the present invention.

FIG. 1 is a schematic and diagrammatic view of a main portion of a projection exposure apparatus according to an embodiment of the present invention. In this embodiment, the invention is applied to a scanner, that is, a step-and-scan type projection exposure apparatus, wherein a pulse emission type excimer laser is used as an exposure light source.

In FIG. 1, a light beam emitted from a pulse emission type excimer laser 1 as an exposure light source is shaped by a beam shaping optical system 2 into exposure light of slit-like shape, being uniform in intensity and in illumination direction. The exposure light is then projected on a reticle 3 which is an original. The reticle 3 has formed thereon a device pattern to be transferred to a wafer 6 which is a substrate. The reticle 3 is placed on a reticle stage 4 which is movable two-dimensionally, and the position of the reticle is controlled together with the reticle stage 4.

An image of the device pattern of the reticle 3 as illuminated is focused and imaged in a slit-like shape, by a projection optical system 5, upon an optically conjugate plane. The projection optical system 5 comprises a bi-telecentric optical system having a reduction ratio of 1:4 or 1:5. The wafer 6 which is the substrate to be exposed is held on a wafer stage 7 by means of a wafer chuck 7a, and the position thereof is controlled together with the wafer stage 7. The wafer 6 has formed thereon a thin coating of photoresist material which is a photosensitive material that effectively produces a photochemical reaction in response to the exposure light. The resist material then functions as an etching mask in a subsequent process.

An exposure focus detecting unit 8 comprises a light projecting system 8a for emitting light and a light receiving system 8b for detecting positional information of reflection light from the wafer 6. It functions to detect the surface level or tilt of the wafer surface portion to be exposed. In scanning exposure, the wafer stage 7 controls the wafer surface portion to be exposed, on the basis of the information detected by the focus detecting unit 8, so that the wafer surface portion is brought into registration with the pattern image plane. In that operation, the reticle stage 4 and the wafer stage 7 are moved in synchronism with each other and relative to the projection optical system 5. Simultaneously therewith, the pattern is transferred onto a photoresist layer on the wafer 6. An alignment detecting unit 9 (to be described later with reference to FIG. 3) operates to detect the position of an alignment mark formed adjacent to a sample shot on the wafer 6. With the motion of the wafer stage 7, it measures plural shot positions. Thus, on the basis of the global alignment method, the wafer position is made.

In FIG. 1, denoted at 11 and 17 are components of a control system in the projection exposure apparatus of this embodiment. More specifically, denoted at 11 is a stage drive control system which has a function for moving the reticle stage 4 and the wafer stage 7. Denoted at 12 is a synchronism control system for performing synchronous running control for the reticle stage 4 and the wafer stage 7 during the scan exposure operation, including position control for a surface to be exposed. Denoted at 13 is a focus measuring system which serves to calculate the level (height) and tilt of the surface to be detected, on the basis of the wafer level information as supplied from the focus detecting unit 8. The focus measuring system then applies the result to the synchronous control system 12. Denoted at 14 is an alignment measuring system, and it operates to calculate the mark position on the basis of an alignment mark signal applied thereto from the alignment detecting unit 9. Also, it functions to calculate the level (height) and tilt of a surface adjacent to the alignment mark, on the basis of a detected value supplied thereto from an AM focus detection system 16 (FIG. 3) which is provided in the alignment detecting unit 9. Denoted at 15 is a main control unit which controls the exposure sequence in the exposure apparatus, in accordance with a job (i.e., a data file necessary for the exposure process and including information related to the wafer and the reticle, such as wafer shot layout, exposure amount or any other exposure conditions). Further, the start or interruption of the operation, control parameters peculiar to the apparatus, or a change of job data are inputted into the main control 15 from an input unit 17 which is a man-machine interface or a media interface, and they are stored into a storing unit 16.

Now, the drive control for the stages as well as the focusing system in this embodiment having a structure such as described above, will be explained. Here, the point of intersection between the optical axis and the image plane of the projection optical system 5 is taken as an origin of coordinates, the image plane is taken as an X-Y plane, the optical axis direction is taken as a Z direction, and the scan direction is taken as a Y direction. Also, the right-hand system rotational directions about the X, Y and Z axes are taken as wx, wy and θ directions, respectively.

The reticle stage 4 is arranged for X-, Y- and θ-axis positioning control on the X-Y plane, and the wafer stage 7 is arranged for six-axis positioning control. Actuators (not shown) for these stages comprise linear motors, and driving electric powers to them are supplied from the stags drive control system 11. Also, these stages are equipped with stage position measuring systems (not shown), respectively. Further, the reticle stage 4 is provided with an X-Y-θ three-axis interferometer system, while the water stage 7 is provided with X-Y-Z-wx-wy-θ six-axis interferometer system. By means of these interferometers, the positions of the reticle stage and the water stage are measured and outputted to the stage drive control system 11. After being processed by the synchronism control system 12, the signal is fed again to the stage drive control system 11 as a driving amount signal, and it is converted into a stage driving electric current.

The position control in the X, Y and θ directions for the exposure process uses a master-slave method wherein, with respect to one subject (master), this other subject (slave) is controlled to follow the master. The reticle stage 4 whose control band is higher is taken as a slave, while the wafer stage 7 is taken as a master, and any positional deviation with respect to this X, Y and θ directions in corrected. The control with respect to the Z, wx and wy directions is carried out on the wafer stage 7 side, to perform correction of wafer surface position and tilt (the position in Z direction and surface tilt wx or wy) as calculated by the focus measuring system 13.

The focus detecting unit 8 which measures the Z-axis position of the wafer 6 surface portion, to be exposed, with respect to the projection optical system 5, is arranged so that six sets of light projecting systems 8a and light receiving systems 8b sandwich the exposure region below the projection optical system 5 therebetween. From each light projecting system 8a, a light beam (detection light) of a non-sensitive wavelength with respect to the photoresist applied to the wafer 6 surface is projected obliquely upon the wafer 6, to form a slit image thereon. Reflection light from the wafer 6 is re-imaged upon a CCD light receiving sensor surface (not shown) inside the light receiving system 8b, as a slit image. The CCD light receiving sensor directly measures the position of the slit image thus formed thereon, such that, on the basis of a difference from a reference position, the position of the slit light on the wafer as well as the position of the reflection surface itself of the wafer 6 can be calculated.

Figure 2:
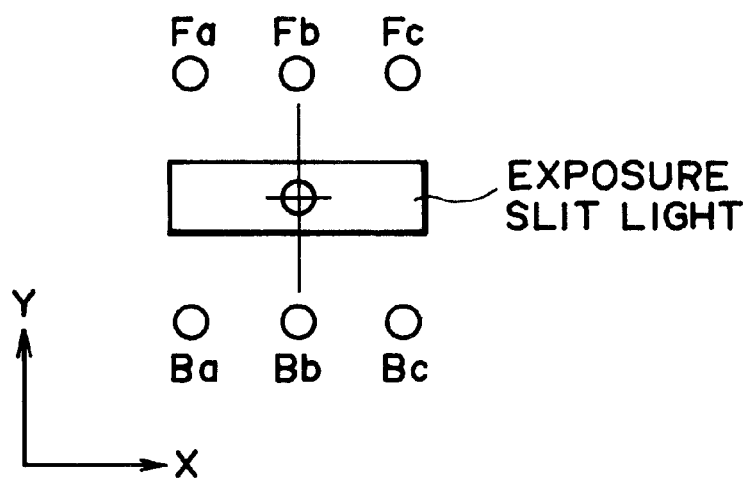
FIG. 2 is a schematic view for explaining a measurement position with respect to an exposed slit light of an exposure focus detecting unit in a projection exposure apparatus according to an embodiment of the present invention.

As shown in FIG. 2, measurement positions (Fa, Fb, Fc, Ba, Bb and Bc) of the six sets of light projecting and receiving systems with respect to the exposure slit light in the focus detecting unit 8 are so arranged that they are spaced away from the exposure slit light in the Y direction (scan direction) by a predetermined distance. Placing the measurement positions spaced away from the exposure slit light by a predetermined distance, as described above, is to enable that the measurement is made prior to the exposure (i.e., pre-reading) to thereby create time to spare, for the focusing. Also, by disposing them symmetrically with respect to the exposure slit light, reciprocal scan exposure is enabled. As regards the measurement slit which performs the measurement, three points are taken as a unit set (in this example, there are a unit set of Fa, Fb and Fc as well as a unit set of Ba, Bb and Bc), and they are arrayed along the X direction which corresponds to the lengthwise direction of the exposure slit light. Also, during the scan, measurement is made to the exposure shot repeatedly with a predetermined pitch in accordance with the measurement sampling time. From the Z-axis positional information obtained at respective detection points, the surface level and surface tilt of the exposure shot region are calculated. The calculation is carried out in the focus measuring system 13, and the thus calculated values are processed by the synchronism control system 13, like the positional information from the stage interferometer system. Also, after the processing, the output is similarly converted by the stage drive control system 11 into a stage driving current to thereby drive control the wafer stage 7 in Z, wx and wy directions.

Figure 3:
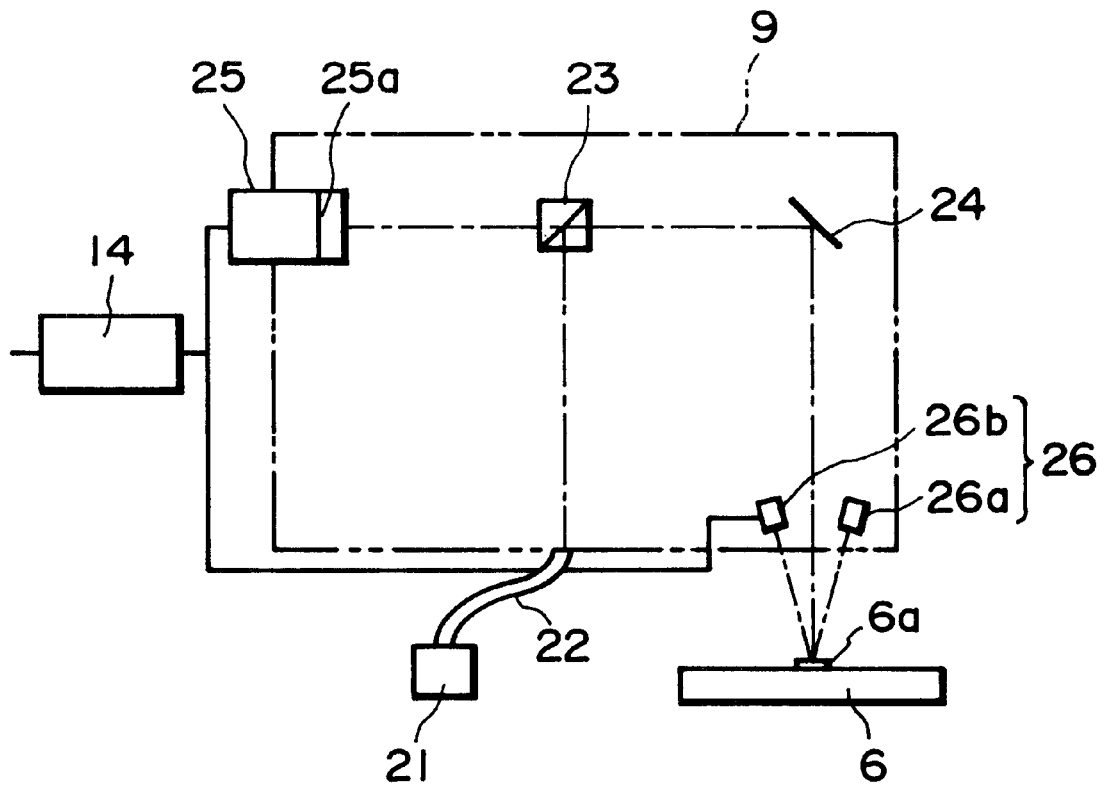
FIG. 3 Is a schematic view of the structure of an alignment detecting unit, in is projection exposure apparatus according to an embodiment of the present invention.

Next, the alignment system will be explained with reference to FIG. 3 which shows a general structure of the alignment detecting unit 9.

The alignment detecting unit 9 is arranged to detect the position of an alignment mark 6a on the wafer 6 surface, with respect to X and Y directions which are orthogonal to the optical axis of the projection optical system 5, and also to detect the surface level and surface tilt close to the alignment mark, namely, to perform detection in Z, wx and wy directions. More specifically, it also has a function as an AM focus detection system for detecting the position of the alignment mark 6a in the optical axis direction. This alignment detecting unit 9 comprises a type wherein the detection is made without intervention of the projection optical system 5, and it is called an off-axis type.

A light beam emitted from an illumination optical system 21, including a light source, is directed by a light guide 22 and is projected into the alignment detecting unit 9. The light is then reflected by a beam splitter 23 and, via a mirror 24, it illuminates the alignment mark 6a on the wafer 6 surface. A signal light which is produced by reflection by the alignment mark 6a on the wafer 6 surface is projected again on the beam splitter 23, via the mirror 24. The signal light thus impinging on the beam splitter 23 is then transmitted therethrough, and an image of the alignment mark 6a is produced on an image pickup surface 25a of a CCD camera 25. A video signal from the CCD camera 25, corresponding to the alignment mark image, is supplied to the alignment measuring system 14. By comparing the alignment mark image with a reference mark image (not shown) prepared beforehand and set in the alignment detecting unit 9, the position of the alignment mark 6a with respect to the X and Y directions is measured.

The AM focus detecting system 26 provided in the alignment detecting unit 9 is arranged so that a light projecting system 26a for emitting light and a light receiving system 26b for detecting the positional information of the reflection light are disposed symmetrically with each other while sandwiching an objective optical axis of the detector therebetween. This is to enable that a surface close to the alignment mark is detected in the vicinity of the objective optical axis of the alignment detecting unit. In total, there are three light projecting systems 26a and three light receiving systems 26b (all of them are not shown). With these light projecting and receiving systems, measurement can be made to three points adjacent to the alignment mark 6a, whereby the wafer surface position (height) as well as the tilt thereof, adjacent to the alignment mark, can be measured simultaneously.

Figure 4:
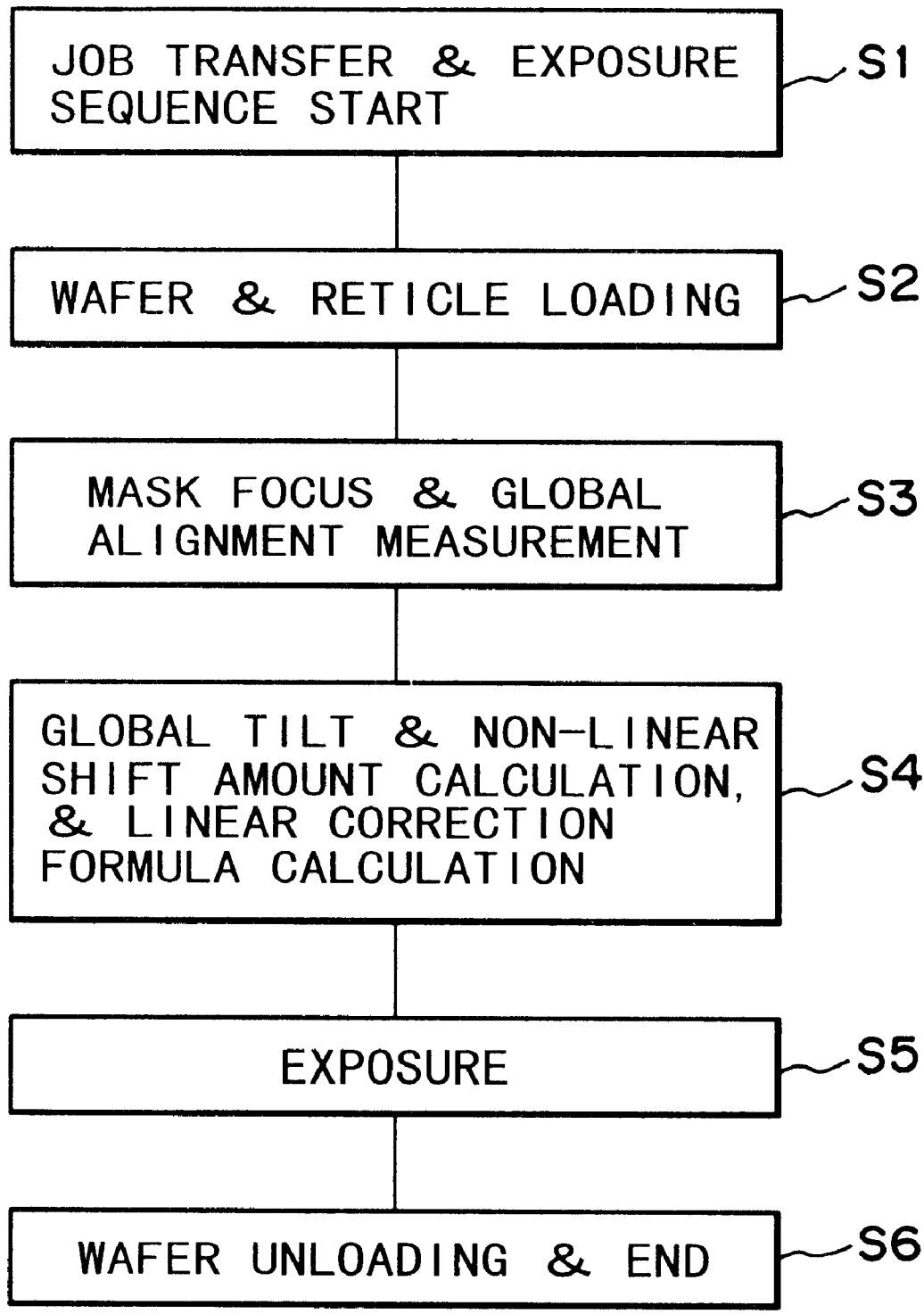
FIG. 4 is a flow chart for explaining a basic sequence in a projection exposure apparatus according to an embodiment of the present invention.

Referring to the flow chart of FIG. 4, the basic sequence in this embodiment will be described. The following explanation will be made on an example of an exposure sequence, to be performed in the processes of manufacturing a semiconductor device having a three-pattern layer structure of layers "a", "b" and "c", in an order from a wafer bulk layer to the above, wherein the exposure of the layer "b" is going to be carried out. Here, it is assumed that the layer "b" will be positioned while using an alignment mark of the "a" layer pattern as a target. Also, for the positioning target of the layer "c", an alignment mark will be formed on the layer "b".

Step S1

Job Transfer and Exposure Sequence Start

First, a job name and an exposure sequence start signal are inputted from the input unit 17. In accordance with the job name thus inputted, the main control 15 searches a corresponding job in the storing unit 16 and reads the same. Here, the job contains various data such as the exposure shot layout, the exposure condition, the position of an alignment mark for layer "b" in every wafer of a lot, having been formed during the exposure of layer "a", the tilt hysteresis information for calculation of a non-linear shift, and the position of an alignment mark to be formed for layer "c" during the exposure of layer "b", for example.

Figure 5A:
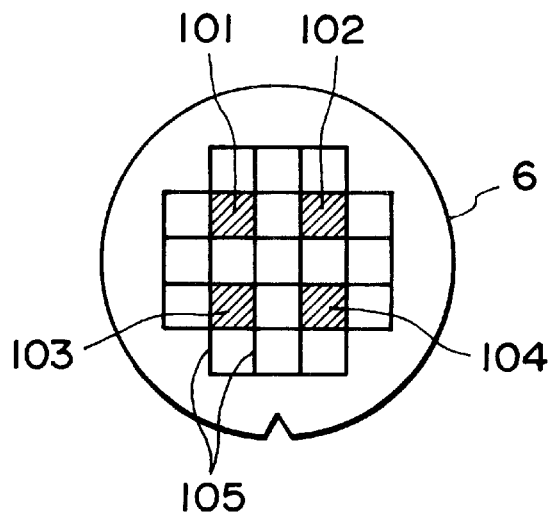
FIG. 5A is a schematic view of am example of as exposure shot layout and sample shots defined. therein.
Figure 5B:
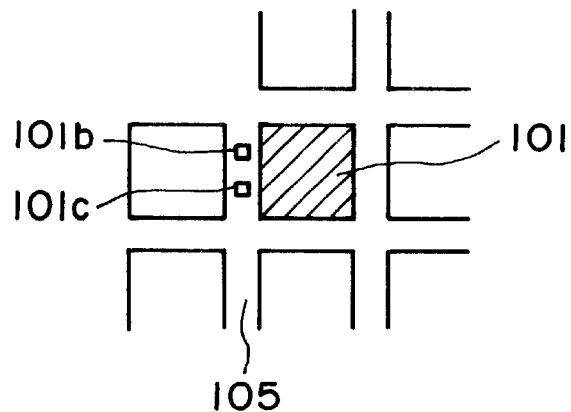
FIG. 5B is a schematic view of an example of disposition of alignment marks.
Figure 6:
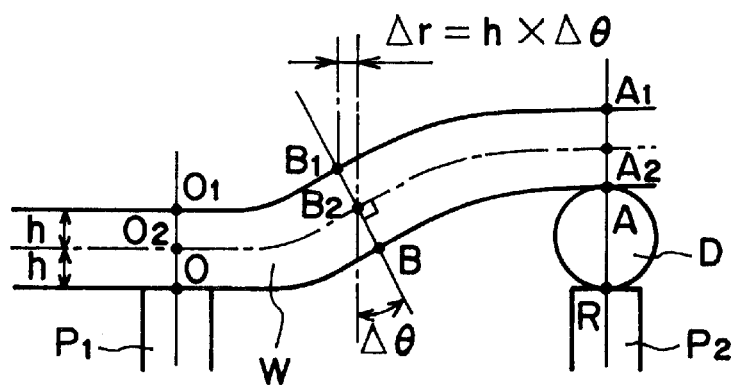
FIG. 6 is a schematic view for explaining a non-linear shift of a wafer as held on a pin contact chuck by attraction.

FIGS. 5A and 5B show an example of an exposure shot layout and sample shots as well as alignment marks. The grid depicts exposure shots. Those shots 101–104 illustrated with hatching are sample shots. As shown in FIG. 5B, on a scribe line 105 which is a clearance area between adjacent exposure shots, there is an alignment mark 101b for the layer "b". In the neighborhood thereof, an alignment mark 101c for the layer "c" will be produced by exposure of the layer "b".

The sequence parameters according to the job information thus read are supplied to the synchronism control system 12 and to a wafer and reticle conveyance control system (not shown).

Step S2

Wafer and Reticle Loading

The wafer and reticle conveyance control system to which the sequence parameters are supplied actuates a wafer and reticle conveying system (not shown) to convey a wafer 6 and a reticle 3 onto the wafer stage 7 and the reticle stage 4, respectively. During conveyance by this wafer and reticle conveying system, each of the wafer 6 and the reticle 3 is roughly aligned with respect to its stage. Although the supply source follows the sequence parameters, usually, a wafer is supplied from a coater developer which is in-line connected to the projection exposure apparatus, while a reticle is supplied from a reticle accommodating unit inside the projection exposure apparatus.

Step S3

Mark Focus and Global Alignment Measurement

The height, tilt and position of the alignment mark of the sample shot, for the layer "b", are then measured in accordance with the job, in the following manner.

The wafer is so fed that the alignment mark 101b (FIG. 5B) of the shot 101 is positioned inside the detection view field of the alignment detecting unit 9. As regards the wafer 6, prior to the alignment measurement for calculation of the shot layout grid thereof, the height $Z_{101b}$ and tilt components $wx_{101b}$ and $wy_{101b}$ of its surface close to the alignment mark 101b are measured by using the AM focus detecting system 26. Thereafter, the wafer 6 is positioned so that the surface thereof is brought into registration with the detection plane level of the alignment detecting unit 9. Generally, this positioning operation is made only with respect to the height direction, since a difference in detected height due to the tilt of the alignment mark is small as compared with the depth of detection so that it can be disregarded.

After the positioning operation, the position of the alignment mark 101b with respect to X and Y directions is detected by means of the alignment detecting unit 9. The detected value is processed by the alignment measuring system 14, whereby the X-Y position $(X_{101b}, Y_{101b})$ thereof is calculated. After measurement of the alignment mark 101b of the shot 101, for layer "b", the wafer 6 is moved to move the adjacent alignment mark 101c, for layer "c", into the detection view field of the alignment detecting unit 9. Then, the height $z_{101c}$ and tilt components $wx_{101c}$ and $wy_{101c}$ of the surface close to the mark are measured. If the alignment marks for layers "b" and "c" are sufficiently close to each other and they have substantially the same surface tilt and it may be considered that $wx_{101b}=wx_{101c}$ and $wy_{101b}=wy_{101c}$, this measurement may be omitted. Whether this measurement should be done or not may be discriminated in the main control unit, on the basis of the distance between the alignment marks for layers "b" and "c".

Subsequently, the wafer 6 is moved by the wafer stage 7, and the shot 102 is moved into the detection view field of the alignment detecting unit 9. Thereafter, measurement operations similar to that for the shot 101 are repeated until measurement of the shot 104 is completed.

The results of detection are supplied from the alignment measuring system 14 to the main control unit 15.

Step S4

Global Tilt and Non-Linear Shift Amount Calculation and Linear Correction Formula Calculation After all the alignment measurements are completed, the main control unit 15 calculates, from the measured height values $Z_{101b}$–$Z_{104b}$ and through the least square approximation, a first order plane as well as tilt components $w_{wx}$ and $w_{wy}$ of the whole wafer surface with respect to the wafer stage running plane (wafer image plane). Then, directions Z, wx and wy of the wafer stage 7 are corrected so that the first order plane is brought into registration with the wafer image plane. This correction sequence is called a global tilt correction.

Subsequently, for calculation of the non-linear shift amount of the alignment mark, the tilt ([$wx_{ib}$], [$wy_{ib}$]) (where i=101, 102, 103 or 104) of the surface close to the alignment mark is detected. The tilt of the surface close the alignment mark can be calculated, while taking into account the tilt ($w_{wx}$, $w_{wy}$) of the wafer whole surface, on the basis of the difference between (i) the tilt of the surface close to the alignment mark at the time of alignment mark measurement and (ii) the tilt of the surface close to the alignment mark at the same time as the same is formed by exposure. Here, the former, namely, the tilt of the surface close to the alignment mark at the time of alignment mark measurement corresponds to the value ($wx_{ib}$, $wy_{ib}$, $wx_{ic}$, $wy_{ic}$) as measured at step S3. The latter, namely, the tilt of the surface close to the alignment mark at the time as the same is formed by exposure (that is, the tilt ([$wx_{iab}$], [$wy_{iab}$]) of the surface close to the alignment mark layer "b" formed during the exposure of layer "a") has been measured and calculated upon exposure of the layer "a", in this embodiment, prior to or subsequent to the exposure of the layer "a", by means of the AM focusing system, and it has been stored into the job inside the storing unit 16 as hysteresis data.

Therefore, the tilt ([$wx_{ib}$], [$wy_{ib}$]) of the surface close to the alignment mark for calculation of the non-linear shift amount, can be detected by reading out the tilt ([$wx_{iab}$], [$wy_{iab}$]) of the surface close to the alignment mark, for layer "b", formed during the exposure of the layer "a", from the job in the storing unit 16, and by calculating the same in accordance with equations (1) and (2) below:

$$[wx_{ib}] = wx_{ib} - w_{wx} = [wx_{iab}] \quad (1)$$

$$[wy_{ib}] = wy_{ib} - w_{wy} = [wy_{iab}] \quad (2)$$

Simultaneously, the tilt ([$wx_{ibc}$], [$wy_{ibc}$]) of the surface close to the alignment mark, for layer "c", to be formed during the exposure of the layer "b", can be calculated from the tilt ($wx_{ic}$, $wy_{ic}$) of the surface close to the alignment mark for layer "c" as has been measured at step S3, and in accordance with equations (3) and (4) below:

$$[wx_{ibc}] = wx_{ic} - w_{wx} \quad (3)$$

$$[wy_{ibc}] = wy_{ic} - w_{wy} \quad (4)$$

These values [$wx_{ibc}$] and [$wy_{ibc}$] are automatically stored into a job, inside the storing unit 16, for exposure of layer "c" in a subsequent process, as alignment mark tilt hysteresis data for that wafer. The data will be used during the exposure of layer "c".

The non-linear shift components $\Delta x_i$ and $\Delta y_i$ can be calculated from the tilt components [$wx_{ib}$] and [$wy_{ib}$] of the surface close to the alignment mark having been calculated as described above. By correcting the alignment measured values $X_i$ and $Y_i$ in accordance with equations (5) and (6) below, true values [$X_i$] and [$Y_i$] can be obtained (here, the wafer thickness is Zh). That is:

$$[X_i] = X_i - \Delta x_i = X_i - h \cdot [wx_{ib}] \quad (5)$$

$$[Y_i] = Y_i - \Delta y_i = Y_i - h \cdot [wy_{ib}] \quad (6)$$

From these true values [$X_i$] and [$Y_i$], a linear correction formula in relation to the position is prepared, and all the shot positions are estimated.

Step S5

Exposure

The position of the exposure slit light is put in registration with the scan start position for a first exposure shot region on the wafer 6 and, thereafter, the scan exposure is carried out. At the time of the start of scan, the wafer surface is brought into registration with the stage running plane on the basis of the global tilt correction. In accordance with the focus pre-reading measured value, the wafer stage is controlled with respect to z, wx and wy, and the scan exposure is carried out while performing the focusing of the shot region. Promptly after completion of the exposure, the wafer is moved to place a subsequent shot region, and it is positioned at the scan exposure start position. Thereafter, the scan exposure is repeated in a similar manner. On a wafer, there are shot regions arrayed in a two-dimensional grid. Usually, shots in one row along the X direction are exposed sequentially. After exposures of shots in a single row, the wafer is moved stepwise in Y direction to change the exposure subject shot row, and the exposure process is continued.

Step S6

Wafer Unloading and End

The scan exposure is performed repeatedly. After exposures of all the shots are completed, the wafer 6 is unloaded from the wafer stage 7, and the sequence is finished. When the exposure process is to be done thereafter, the wafer is replaced by a subsequent wafer.

With the exposure sequence described above, a non-linear shift amount to be produced by a wafer surface distributed stress due to deformation of the wafer surface, for example, which results from a foreign substance trapped between the wafer and a chucking pin or from the wafer holding by attraction, can be calculated accurately. Therefore, a proper position linear correction formula based on global alignment is obtainable. Thus, the alignment precision and, therefore, the overlay precision can be improved notably. Further, tilt hysteresis data of an alignment mark to be used in an exposure process for a subsequent layer is automatically obtained. Here, it is to be noted that, while this embodiment has been described with reference to an exposure apparatus of scanner type based on the step-and-scan method, the present invention is applicable quite similarly to a stepper type exposure apparatus.

Next, another embodiment of the present invention will be described.

In the embodiment described above, the non-linear shift of an alignment mark is corrected by using tilt hysteresis data of the surface close to the alignment mark. This can be applied similarly to correction of the exposure shot position. More specifically, the tilt of each exposure shot of layer "a" obtained at the time of the focus measurement, prior to the exposure, may be stored as hysteresis data. By calculating the non-linear shift on the basis of the difference thereof with respect to the focus measured value obtained before exposure shot position can be made. Also, in this case, it should be stored as the positional shift amount of the exposure shot itself, and it should be reflected to the exposure position of the exposure shot of the subsequent layer.

Further, on the basis of the hysteresis data of the positional shift amount of the exposure shot, the shift amount of the alignment mark position of a sample shot may be subtracted from the alignment measured value of an exposure process for a subsequent layer, and then the linear correction formula of global alignment may be determined. The position of the alignment mark may be calibrated on the basis of it.

As regards the non-linear shift correction of the exposure shot in this embodiment, it is attainable throughout the whole region of the scan direction inside the exposure shot when the exposure apparatus is of scanner type. For an exposure apparatus of stepper type, the correction can be made only with respect to the central position of the exposure shot.

In this embodiment, as described above, a non-linear shift as well, produced in each exposure shot, can be corrected and, therefore, the overlay precision can be improved largely.

For exposure of layer "a", that is, the first layer for which no alignment operation is made with respect to an underlying pattern, the non-linear shift amount due to the tilt of each exposure shot may be reflected to the exposure shot position. Here, since the non-linear shift with respect to an absolute grid is dissolved when the tilt of each exposure shot is removed, it means reversely that the non-linear shift is produced in proportion to the tilt. Therefore, without using the hysteresis data of the tilt of each exposure shot in the exposure process of a preceding layer, the exposure position may be corrected in proportion to the tilt amount of the exposure shot of the current layer. Further, as regards the alignment mark, the tilt adjacent to the mark as well as the non-linear shift amount at the time of exposure of a corresponding sample shot may be stored as hysteresis data, and it may be reflected to the global alignment.

In accordance with this embodiment, a non-linear shift amount to be produced by a substrate surface distributed stress due to deformation of the substrate surface, for example, which results from a foreign substance trapped between the substrate and a chucking pin or from the substrate holding by attraction, can be calculated accurately. Therefore, precise position correction for the non-linear shift can be attained. As a result, the alignment precision and, therefore, the overlay precision can be improved notably.

Further, as regards the exposure shot position, the tilt of each exposure shot of layer "a" obtained at the time of the focus measurement, prior to the exposure, may be stored as hysteresis data. By calculating the non-linear shift on the basis of the difference thereof with respect to the focus measured value obtained before exposure of layer "b", correction of the exposure shot position can be made very precisely. Therefore, the overlay precision can be improved significantly.

Next, an embodiment of a semiconductor device manufacturing method which uses a projection exposure apparatus according to any one of the preceding embodiments, will be explained.

Figure 7:
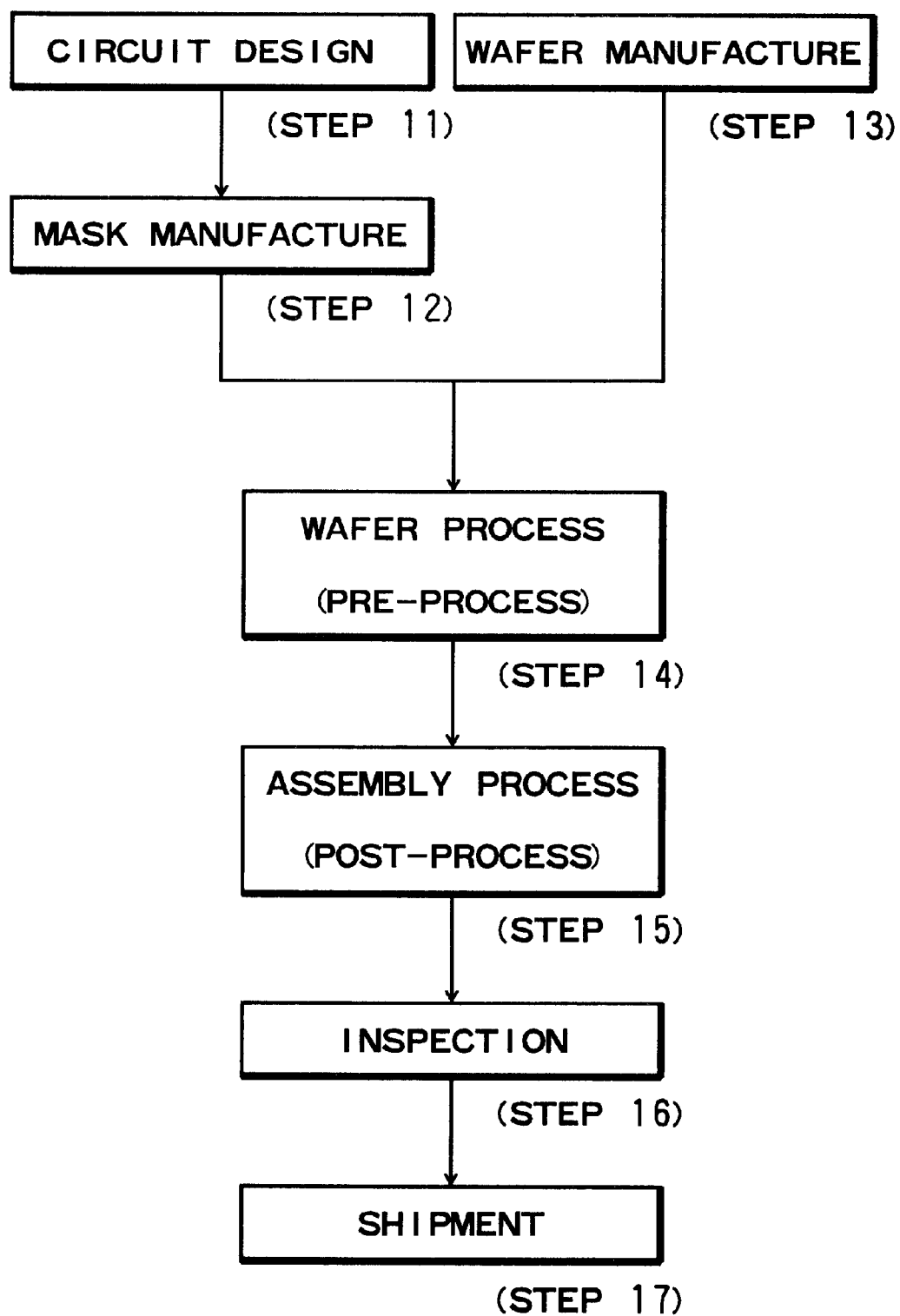
FIG. 7 is a flow chart of semiconductor device manufacturing processes.

FIG. 7 is a flow chart of a procedure for the manufacture of microdevices such as semiconductor chips (e.g., ICs or LSIs), liquid crystal panels, CCDs, thin film magnetic heads or micro-machines, for example.

Step 11 is a design process for designing a circuit of a semiconductor device. Step 12 is a process for making a mask on the basis of the circuit pattern design. Step 13 is a process for preparing a wafer by using a material such as silicon. Step 14 is a wafer process (called a pre-process) wherein, by using the so prepared mask and wafer, circuits are practically formed on the wafer through lithography. Step 15 subsequent to this is an assembling step (call a post-process) wherein the wafer having been processed by step 14 is formed into semiconductor chips. This step includes an assembling (dicing and bonding) process and a packaging (chip sealing) process. Step 16 is an inspection step wherein an operation check, a durability check and so on for the semiconductor devices provided by step 15, are carried out. With these processes, semiconductor devices are completed and they are shipped (step 17).

Figure 8:
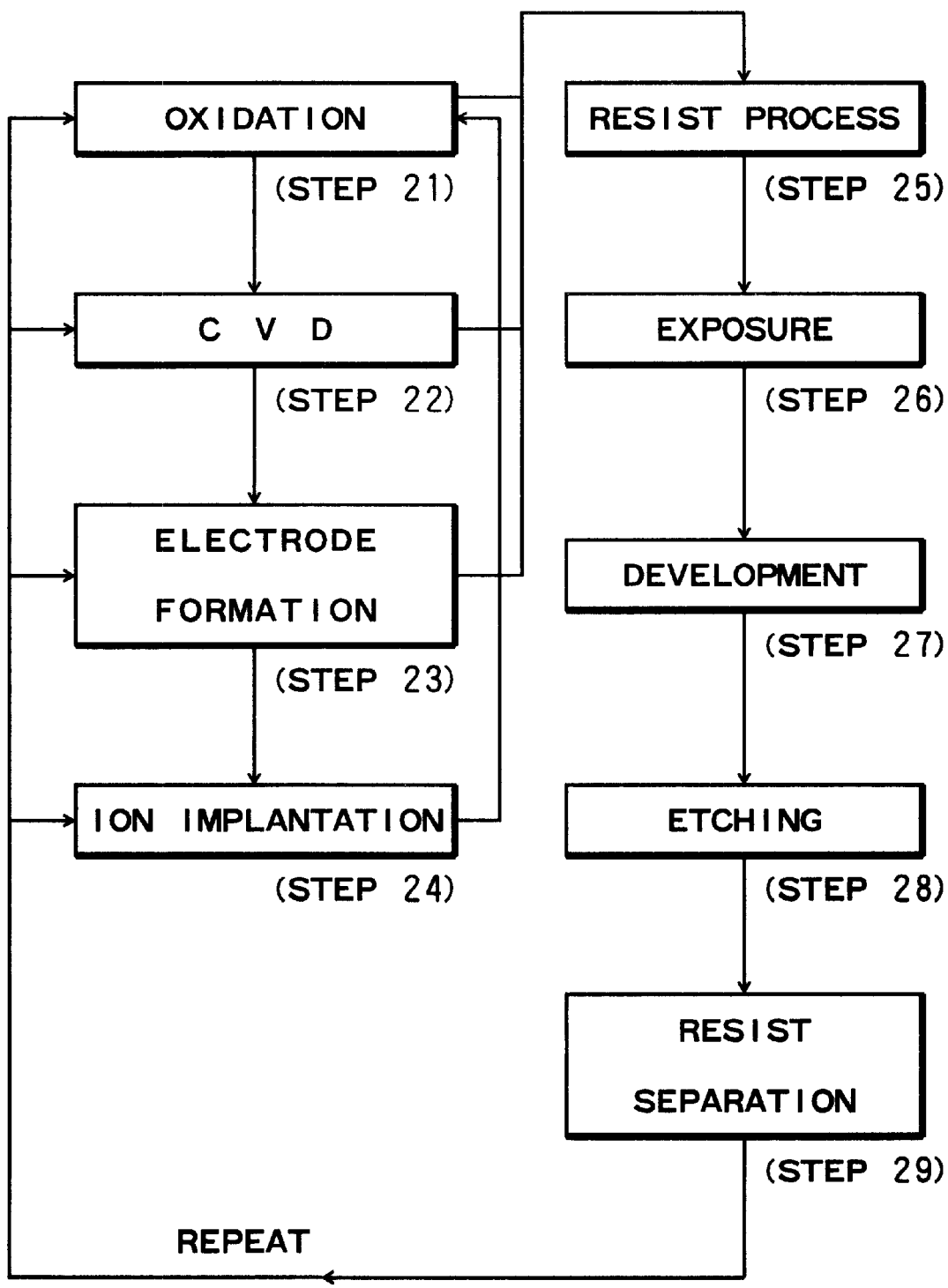
FIG. 8 is a flow chart for explaining details of a wafer process included in the procedure shown in FIG. 7.

FIG. 8 is a flow chart showing details of the wafer process.

Step 21 is an oxidation process for oxidizing the surface of a wafer. Step 22 is a CVD process for forming an insulating film on the wafer surface. Step 23 is an electrode forming process for forming electrodes upon the wafer by vapor deposition. Step 24 is an ion implanting process for implanting ions to the wafer. Step 25 is a resist process for applying a resist (photosensitive material) to the wafer. Step 26 is an exposure process for printing, by exposure, the circuit pattern of the mask on the wafer through the exposure apparatus described above. Step 27 is a developing process for developing the exposed wafer. Step 28 is an etching process for removing portions other than the developed resist image. Step 29 is a resist separation process for separating the resist material remaining on the wafer after being subjected to the etching process. By repeating these processes, circuit patterns are superposedly formed on the wafer.

With these processes, high density microdevices can be manufactured.

In accordance with the present invention, as described hereinbefore, a non-linear shift of an alignment mark or an exposure shot due to distortion of a substrate such as a wafer, along the substrate surface direction, produced at the substrate chucking, can be calculated accurately and, then, the position control can be made. By performing an exposure process with the position correction for the non-linear shift, the overlay precision can be improved notably.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for exposing a substrate to a pattern of an original, said apparatus comprising:
   a first detector for detecting a tilt of an alignment mark on the substrate;
   a second detector for detecting a position of the alignment mark on the substrate; and
   a calculation unit for calculating a target position of an exposure shot on the substrate, on the basis of the tilt of the alignment mark detected by said first detector and the position of the alignment mark detected by said second detector.

2. An apparatus according to claim 1, wherein said calculation unit serves to correct the position of the alignment mark detected by said second detector, on the basis of the tilt of the alignment mark detected by said first detector.

3. An apparatus according to claim 1, further comprising an alignment mechanism for estimating positions of exposure shots on the substrate, on the basis of results of detection by said second detector and for positioning each of the exposure shots within an exposure region of said apparatus.

4. An apparatus according to claim 1, further comprising a storing unit for storing a detection result obtained, on transferring the alignment mark on the substrate, by said first detector.

5. An apparatus according to claim 4, wherein said calculation unit calculates the target position of the exposure shot, on the basis of a difference between tilt of the alignment mark stored by said storing unit and tilt of the alignment mark detected, on detecting the position of the alignment mark by said second detector, by said first detector.

6. An apparatus according to claim 1, wherein said first detector performs the detection of the tilt prior to the detection of the position by said second detector, with respect to the same alignment mark.

7. An apparatus according to claim 1, wherein said calculation unit calculates the target position of the exposure shot on the basis of the tilt of the alignment mark detected by said first detector and the position of the alignment mark detected by said second detector, for an exposure shot of a first layer on the substrate.

8. A device manufacturing method including a process of exposing a substrate with a pattern, said method comprising:

- a first detecting step for detecting a tilt of an alignment mark on the substrate;
- a second detecting step for detecting a position of the alignment mark on the substrate;
- a calculating step for calculating a target position of an exposure shot on the substrate, on the basis of the tilt of the alignment mark detected in said first detecting step, and the position of the alignment mark detected in said second detecting step;
- a positioning step for positioning an exposure shot on the substrate, on the basis of the target position calculated in said calculating step; and
- exposing an exposure shot on the substrate, positioned in said positioning step, to the pattern for the device manufacture.

9. A method according to claim 8, wherein said calculating step serves to correct the position of the alignment mark detected in said second detecting step, on the basis of the tilt of the alignment mark detected in said first detecting step.

10. A method according to claim 8, further comprising an alignment step for estimating positions of exposure shots on the substrate, on the basis of results of the detection in said second detecting step and for positioning each of the exposure shots within an exposure region.

11. A method according to claim 8, further comprising a storing step for storing a detection result obtained, on transferring the alignment mark on the substrate, in said first detecting step.

12. A method according to claim 11, wherein said calculating step calculates the target position of the exposure shot, on the basis of a difference between tilt of the alignment mark stored in said storing step and the tilt of the alignment mark detected, on detecting the position of the alignment mark in said second detecting step, in said first detecting step.

13. A method according to claim 8, wherein said first detecting step performs the detection of the tilt prior to the detection of the position in said second detecting step, with respect to the same alignment mark.

14. A method according to claim 8, wherein said calculating step calculates the target position of the exposure shot on the basis of the tilt of the alignment mark detected in said first detecting step and the position of the alignment mark detected in said second detecting step, for an exposure shot of a first layer on the substrate.

* * * * *

UNITED STATES PATENT AND TRADEMARK OFFICE
CERTIFICATE OF CORRECTION

PATENT NO. : 6,654,096 B1 Page 1 of 1
DATED : November 25, 2003
INVENTOR(S) : Itaru Fujita et al.

It is certified that error appears in the above-identified patent and that said Letters Patent is hereby corrected as shown below:

Column 3,
Line 24, "is" should read -- is a --.

Column 4,
Line 55, "value $\Delta\theta$," should read -- value $\Delta\theta_{pr}$, --.

Column 5,
Line 38, "of.a" should read -- of a --.
Line 46, "Is" should read -- is --.
Line 47, "is" should read -- a --.
Line 51, "invention:" should read -- invention. --.
Line 52, "am" should read -- an -- and "as" should read -- an --.
Line 53, "defined." should read -- defined --.

Column 7,
Line 31, "water" should read -- wafer --.

Column 11,
Line 54, "is Zh)." should read -- is 2h). --.

Column 12,
Line 6, "to z," should read -- to Z, --.

Signed and Sealed this

Twenty-seventh Day of April, 2004

JON W. DUDAS
*Acting Director of the United States Patent and Trademark Office*